United States Patent
Chiang et al.

(10) Patent No.: US 11,338,325 B2
(45) Date of Patent: May 24, 2022

(54) TOUCH FEEDBACK AND SENSING DEVICE

(71) Applicants: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

(72) Inventors: Ming-Ta Chiang, Zhunan (TW); Min-Yu Kan, Zhunan (TW); Meng-Zhu Ma, Shenzhen (CN); Huan Ding, Shenzhen (CN); Yu-Ju Chen, Zhunan (TW)

(73) Assignees: Interface Technology (ChengDu) Co., Ltd., Chengdu (CN); INTERFACE OPTOELECTRONICS (SHENZHEN) CO., LTD., Shenzhen (CN); GENERAL INTERFACE SOLUTION LIMITED, Zhunan (TW)

( * ) Notice: Subject to any disclaimer, the term of this patent is extended or adjusted under 35 U.S.C. 154(b) by 438 days.

(21) Appl. No.: 16/509,609

(22) Filed: Jul. 12, 2019

(65) Prior Publication Data
US 2020/0360967 A1  Nov. 19, 2020

(30) Foreign Application Priority Data

May 16, 2019 (CN) .......................... 201910405955.8

(51) Int. Cl.
| | | |
|---|---|---|
| *B06B 1/06* | (2006.01) | |
| *H01L 41/18* | (2006.01) | |
| *G01L 1/22* | (2006.01) | |
| *G06F 3/01* | (2006.01) | |
| *H01L 41/047* | (2006.01) | |
| *H01L 41/08* | (2006.01) | |
| *H01L 41/187* | (2006.01) | |

(52) U.S. Cl.
CPC ............ *B06B 1/064* (2013.01); *G01L 1/2262* (2013.01); *G06F 3/016* (2013.01); *H01L 41/0475* (2013.01); *H01L 41/0825* (2013.01); *H01L 41/1876* (2013.01)

(58) Field of Classification Search
CPC .. B06B 1/064; H01L 41/0475; H01L 41/0825
USPC ....................................................... 310/338
See application file for complete search history.

(56) References Cited

U.S. PATENT DOCUMENTS

| | | | |
|---|---|---|---|
| 6,664,717 B1 * | 12/2003 | Mohr, III ................ B06B 1/064 | |
| | | | 310/328 |
| 10,631,400 B1 * | 4/2020 | Tsai ....................... G01L 1/2287 | |
| 2020/0278748 A1 * | 9/2020 | Tsai ..................... H01L 41/1871 | |

* cited by examiner

*Primary Examiner* — Derek J Rosenau
(74) *Attorney, Agent, or Firm* — ScienBiziP, P.C.

(57) ABSTRACT

A touch feedback and sensing device includes a circuit board, a piezoelectric ceramic actuator on the circuit board; and at least one strain sensor on the circuit board. The piezoelectric ceramic actuator includes a piezoelectric ceramic block, a cathode and an anode on the piezoelectric ceramic block. Different voltages are applied to the cathode and the anode to vibrate the piezoelectric ceramic block. The circuit board vibrates with vibration of the piezoelectric ceramic block. The at least one strain sensor is configured to detect and monitor vibration of the circuit board.

9 Claims, 8 Drawing Sheets

TOUCH FEEDBACK AND SENSING DEVICE

FIELD

The subject matter herein generally relates to a touch feedback and sensing device.

BACKGROUND

Feedback for touches (touch feedback) is popular, being applied to various electronic devices such as a flat keyboard. The touch feedback component simulates a traditional keyboard and mouse, and generates feedback during a touch operation. The touch feedback component may include types such as (1) actuator, which is driven by a coil motor, by piezoelectric switch, or by MEMS microelectromechanical switch, and (2) electric field type touch feedback by fingers feeling a repulsive force of the electric field charge. Other types include (3) capacitive touch feedback, magnetic repulsive force charged by a strong iron capacitor film and (4) touch feedback of ultrasonic waves, applying voltage through the piezoelectric ceramic to generate vibration and perceptible deformation.

BRIEF DESCRIPTION OF THE DRAWINGS

Implementations of the present technology will now be described, by way of embodiment, with reference to the attached figures.

DETAILED DESCRIPTION

Figure 1:
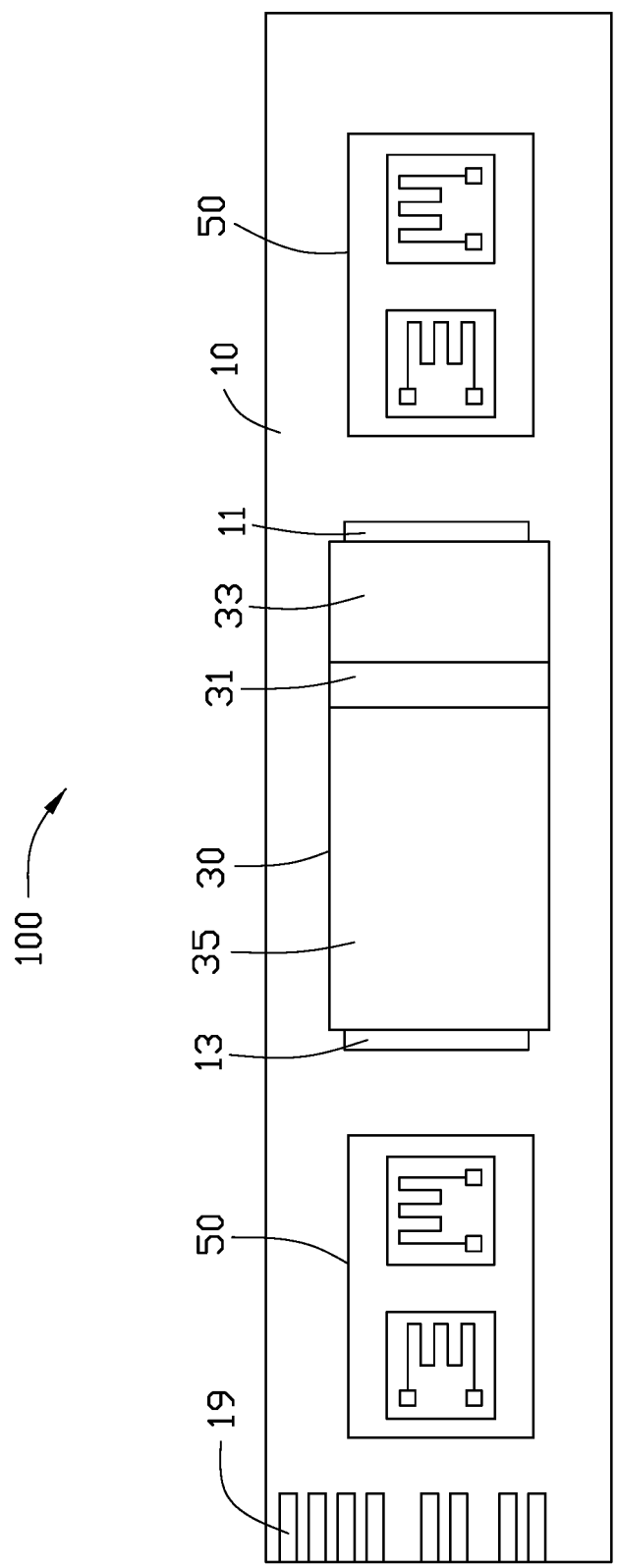
FIG. 1 is a bottom view of a touch feedback and sensing device according to a first embodiment of the present disclosure.

It will be appreciated that for simplicity and clarity of illustration, where appropriate, reference numerals have been repeated among the different figures to indicate corresponding or analogous elements. In addition, numerous specific details are set forth in order to provide a thorough understanding of the embodiments described herein. However, it will be understood by those of ordinary skill in the art that the embodiments described herein may be practiced without these specific details. In other instances, methods, procedures, and components have not been described in detail so as not to obscure the related relevant feature being described. Also, the description is not to be considered as limiting the scope of the embodiments described herein. The drawings are not necessarily to scale and the proportions of certain parts may be exaggerated to better illustrate details and features of the present disclosure.

The term "coupled" is defined as coupled, whether directly or indirectly through intervening components, and is not necessarily limited to physical connections. The connection can be such that the objects are permanently coupled or releasably coupled. The term "comprising" when utilized, means "including, but not necessarily limited to"; it specifically indicates open-ended inclusion or membership in the so-described combination, group, series, and the like.

First Embodiment

FIG. 1 illustrates a touch feedback and sensing device 100 according to a first embodiment of the present disclosure. The touch feedback and sensing device 100 includes a circuit board 10, a piezoelectric ceramic actuator 30 on the circuit board 10, and at least one strain sensor 50 located on the circuit board 10.

The circuit board 10 may be a metal-core printed circuit board 10 (MCPCB) that includes a printed circuit board attached to a metal layer. The metal layer has good heat-conducting property, which can improve heat dissipation of the circuit board. In this embodiment, the circuit board 10 includes a stainless steel layer (not shown) and a thermally-conductive polymer layer (not shown) on the stainless steel layer.

Figure 2:
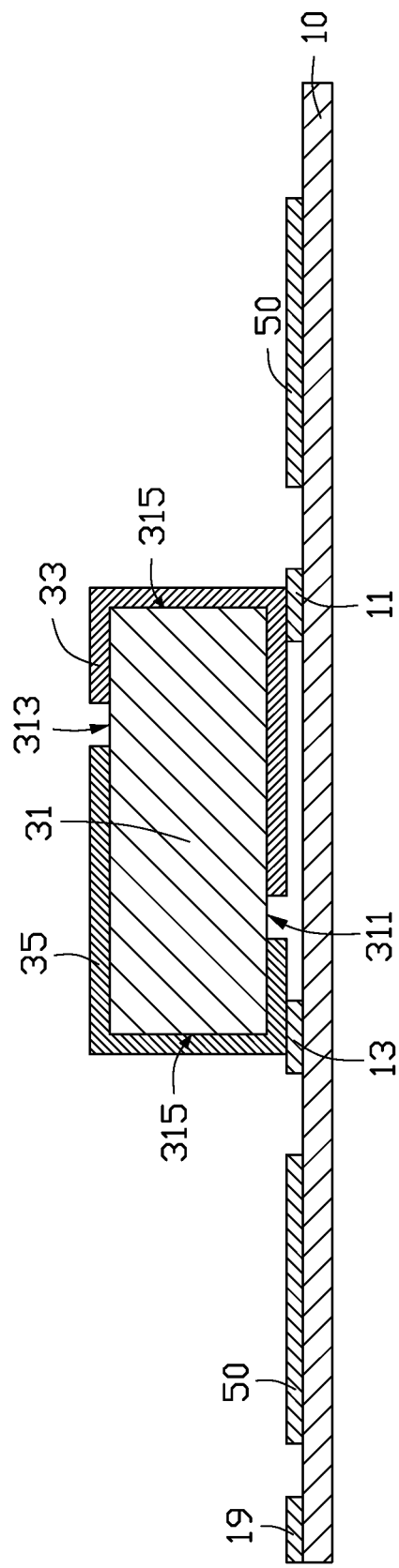
FIG. 2 is a cross-sectional view of the touch feedback and sensing device of FIG. 1.

Referring to FIG. 1 and FIG. 2, the piezoelectric ceramic actuator 30 includes a piezoelectric ceramic block 31, a cathode 33 on the piezoelectric ceramic block 31, and an anode 35 on the piezoelectric ceramic block 31. The cathode 33 and the anode 35 are electrically insulated from each other. In the present embodiment, the piezoelectric ceramic block 31 substantially has a shape of a rectangular block. As shown in FIG. 2, the piezoelectric ceramic block 31 includes a bottom surface 311, a top surface 313 opposite to the bottom surface 311, and several side surfaces 315 coupling between the bottom surface 311 and the top surface 313. The bottom surface 311 is adjacent to the circuit board 10, the top surface 313 is away from the circuit board 10. The cathode 33 partially covers the bottom surface 311 and bends to cover one side surface 315 and partially cover the top surface 313. The anode 35 partially covers the top surface 313 and bends to cover one side surface 315 and partially cover the bottom surface 311. An area of the anode 35 covering the top surface 313 is greater than an area of the cathode 33 covering the top surface 313. An area of the cathode 33 covering the bottom surface 311 is greater than an area of the anode 35 covering the bottom surface 311. Both the cathode 33 and the anode 35 are spaced apart from each other such that they are electrically insulated from each other.

The strain sensor 50 is conventional, a sensing circuit that includes resistors using Wheatstone bridge may be included. FIG. 1 and FIG. 2 do not specifically illustrate any circuit configuration. As shown in FIGS. 1 and 2, there are two strain sensors 50. The two strain sensors 50 are located on opposite sides of the piezoelectric ceramic actuator 30, and each strain sensor 50 is spaced apart from the piezoelectric ceramic actuator 30. One strain sensor 50 is disposed on each of the opposite sides of the piezoelectric ceramic actuator 30 for the purpose of more effectively transmitting electrical signals generated by the piezoelectric effect.

The bottom surface 311 carries a portion of the cathode 33 and a portion of the anode 35 such that the cathode 33 and the anode 35 can be electrically connected to the circuit board 10. As shown in FIG. 1, the circuit board 10 is provided with a cathode electrode 11 and an anode electrode 13, wherein the cathode electrode 11 is electrically connected to the cathode 33, and the anode electrode 13 is electrically connected to the anode 35.

The circuit board 10 applies different voltages to the cathode electrode 11 and to the anode electrode 13. For example, the cathode electrode 11 is applied with a square wave signal, and the anode electrode 13 is applied with a zero or ground potential, thereby causing the cathode 33 and the anode 35 on the piezoelectric ceramic block 31 to have different voltages. The piezoelectric ceramic block 31 vibrates under the voltage difference, and the waveform of the vibration reflects the square wave signal of the input cathode electrode 11. The vibration of the piezoelectric ceramic block 31 drives the entire circuit board 10 to vibrate, and the strain sensor 50 detects and monitors the vibration (strain behavior) of the circuit board 10. If an external force touches the circuit board 10 to change the vibration of the circuit board 10, a waveform and an amplitude detected by the sensor 50 change, and the strain sensor 50 returns a signal to a touch circuit (not shown) to achieve a touch response. The touch signal can reflect the signal change of the strain sensor 50.

Various connecting terminals 19 may be disposed on the circuit board 10 to connect other electronic components (not shown), such as a circuit, a power supply, an amplifier, and the like.

The touch feedback and sensing device 100 of the present embodiment has good performance and high sensing precision.

Second Embodiment

Figure 3:
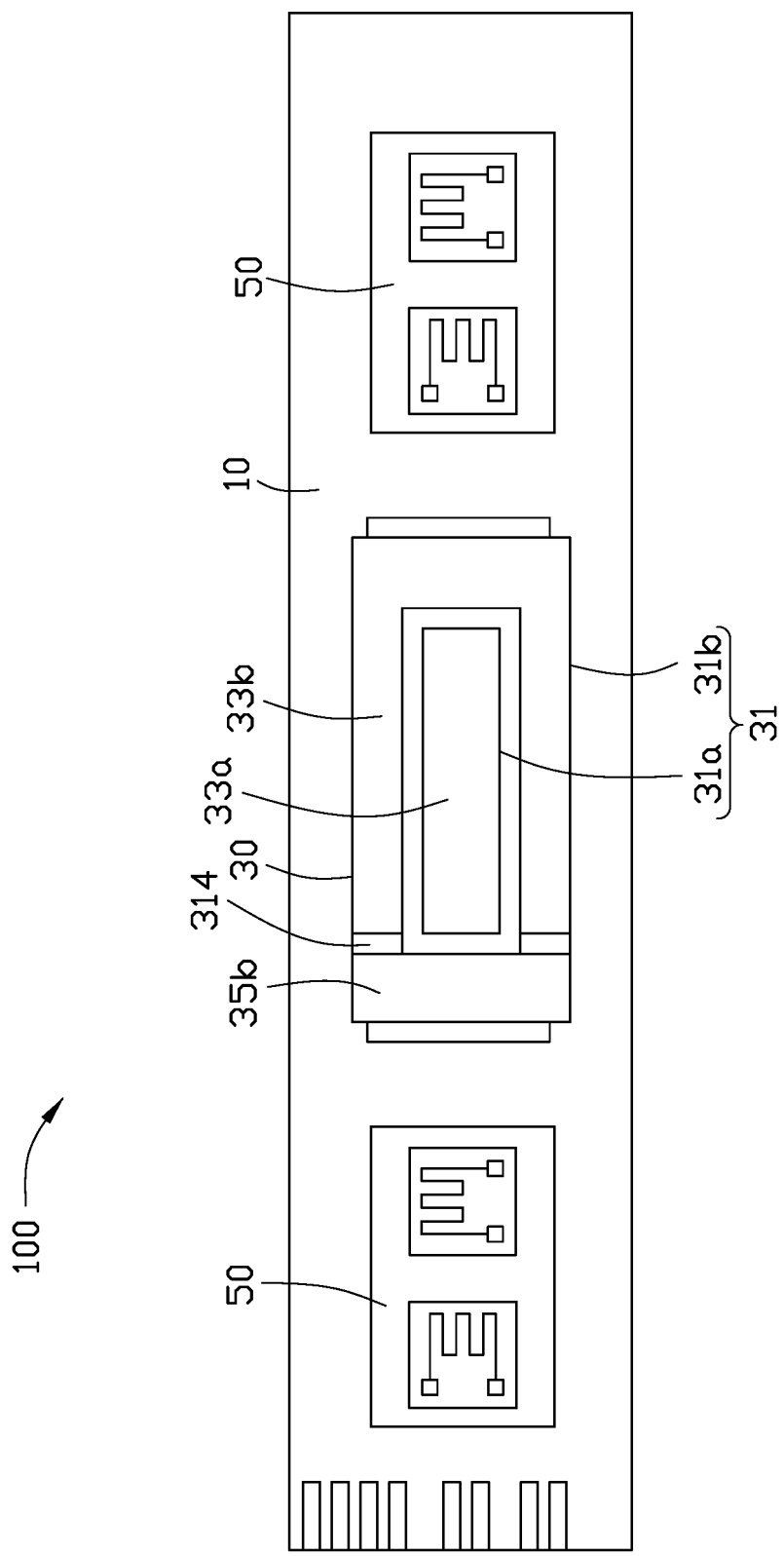
FIG. 3 is a bottom view of a touch feedback and sensing device according to a second embodiment of the present disclosure.
Figure 4:
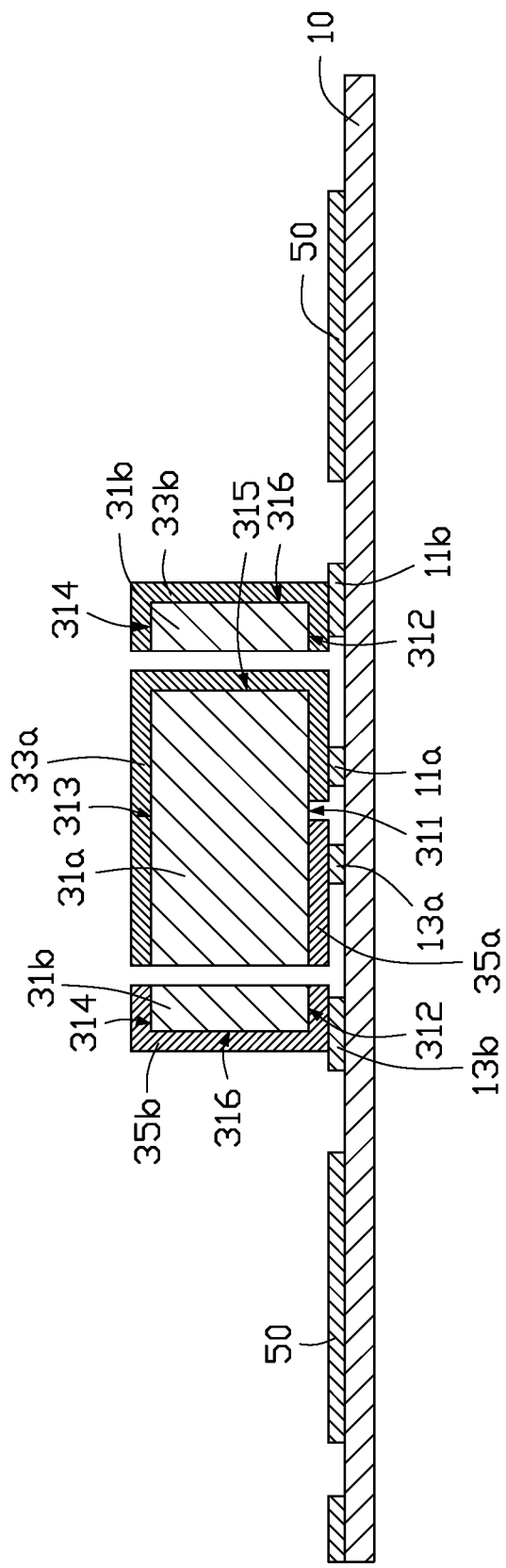
FIG. 4 is a cross-sectional view of the touch feedback and sensing device of FIG. 2.

FIG. 3 and FIG. 4 illustrate a touch feedback and sensing device 200 according to a second embodiment of the present disclosure. The touch feedback and sensing device 200 includes a circuit board 10, a piezoelectric ceramic actuator 30, and at least one strain sensor 50 located on the circuit board 10.

The piezoelectric ceramic actuator 30 includes a piezoelectric ceramic block 31. The piezoelectric ceramic block 31 includes an inner ceramic element 31a and an outer ceramic element 31b. The outer ceramic element 31b surrounds the inner ceramic element 31a and is spaced apart from the inner ceramic element 31a. The piezoelectric ceramic actuator 30 further includes a first cathode 33a and a first anode 35a disposed on the inner ceramic element 31a. A second cathode 33b and a second anode 35b are disposed on the outer ceramic element 31b. The first cathode 33a and the first anode 35a are electrically insulated from each other, and the second cathode 33b and the second anode 35b are electrically insulated from each other.

Referring to FIG. 3 and FIG. 4, in the present embodiment, the inner ceramic element 31a is a rectangular block, the bottom view of the inner ceramic element 31a shows the rectangularity. The inner ceramic element 31a includes a bottom surface 311 adjacent to the circuit board 10, a top surface 313 away from the circuit board 10 and opposite to the bottom surface 311, and several side surfaces 315 between the bottom surface 311 and the top surface 313. The first cathode 33a covers the top surface 313 of the inner ceramic element 31a and bends to cover one side surface 315. The first cathode 33a continues to bend to partially cover the bottom surface 311. The first anode 35a partially covers the bottom surface 311 of the inner ceramic element 31a. An area of the first cathode 33a covering the bottom surface 311 is less than an area of the first anode 35a covering the bottom surface 311. The first cathode 33a and the first anode 35a are spaced apart from each other such that they are electrically insulated from each other. The number of side surfaces 315 can vary depending on a shape of the inner ceramic element 31a. For example, when the inner ceramic elements 31a are cylindrical in shape, there is only one side surface 315 and the one side surface 315 is always a curved surface.

A bottom view of the outer ceramic element 31b shows a rectangular ring shape and includes a lower surface 312 adjacent to the circuit board 10, an upper surface 314 away from the circuit board 10 and opposite to the lower surface 312, and several lateral surfaces 316 between the lower surface 312 and the upper surface 314. The number of lateral surfaces 316 varies according to a shape of the outer ceramic element 31b. For example, the outer ceramic element 31b can be cylindrical, and then there is only one lateral surface 316 and the one lateral surface 316 is always a curved surface. The second cathode 33b partially covers the upper surface 314 of the outer ceramic element 31b and bends to cover one lateral surface 316 of the outer ceramic element 31b. The second cathode 33b continues to bend and partially cover the lower surface 312 of the outer ceramic element 31b. The second anode 35b partially covers the lower surface 312 of the outer ceramic element 31b and bends to cover one lateral surface 316 of the outer ceramic element 31b. The second anode 35b continues to bend to partially cover the upper surface 314 of the outer ceramic element 31b. As shown in FIG. 3, an area of the second cathode 33b covering the upper surface 314 is greater than an area of the second anode 35b covering the upper surface 314.

As shown in FIG. 4, a first cathode electrode 11a, a first anode electrode 13a, a second cathode electrode 11b, and a second anode electrode 13b are provided on the circuit board 10. The first cathode electrode 11a is electrically connected to the first cathode 33a and the first anode electrode 13a is electrically connected to the first anode 35a. The second cathode electrode 11b is electrically connected to the second cathode 33b and the second anode electrode 13b is electrically connected to the second anode 35b. The circuit board 10 applies different voltages to the first cathode electrode 11a and the first anode electrode 13a, thus the inner ceramic element 31a vibrates under the voltage difference. At the same time, the circuit board 10 applies different voltages to the second cathode electrode 11b and the second anode electrode 13b, thus the outer ceramic element 31b vibrates under the voltage difference. The inner ceramic element 31a receives voltage signals by the first cathode electrode 11a and the first anode electrode 13a, and the outer ceramic element 31b receives voltage signals by the second cathode electrode 11b and the second anode electrode 13b.

In one embodiment, the voltage signals applied to the first cathode electrode 11a and the first anode electrode 13a are different from the voltage signals applied to the second cathode electrode 11b and the second anode electrode 13b. The inner ceramic element 31a and the outer ceramic element 31b can thereby produce two different vibration waveforms and resonances that form different feedback sensations for touches applied.

Figure 5:
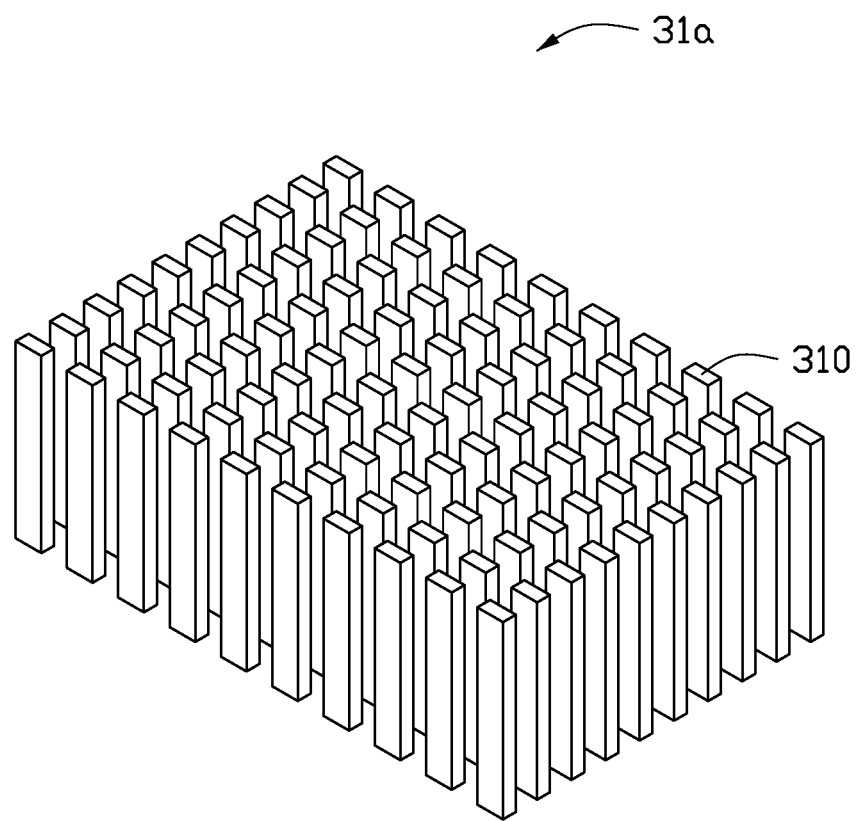
FIG. 5 is an isometric view of an inner ceramic element in the touch feedback and sensing device of FIG. 2.

In one embodiment, the voltage signals applied to the first cathode electrode 11a and the first anode electrode 13a are the same as the voltage signals applied to the second cathode electrode 11b and the second anode electrode 13b. The voltage signals applied to the first cathode electrode 11a and the second cathode electrodes 11b are the same, and the voltage signals applied to the first anode electrode 13a and the second anode electrode 13b are the same. However, the inner ceramic element 31a and the outer ceramic element 31b can be made of different piezoelectric ceramic elements. Due to differences in piezoelectric characteristics and areas between the inner ceramic element 31a and the outer ceramic element 31b, the inner ceramic element 31a and the outer ceramic element 31b produce resonances of two different vibration waveforms and form a different feedback for touches. For example, the outer ceramic element 31b can be a lead zirconate titanate (PZT) piezoelectric ceramic having a thickness of 100-400 micrometers, and the inner ceramic element 31a can include a plurality of piezoelectric ceramic units 310 having a columnar structure and spaced apart from each other, as shown in the FIG. 5. At this time, the first cathode 33a covers the top surfaces 313 of all the piezoelectric ceramic units 310 away from the circuit board 10, and the first anode 35a covers the bottom surfaces 311 of all the piezoelectric ceramic units 310 adjacent to the circuit board 10.

In one embodiment, the inner ceramic element 31a produces high-frequency vibration, and the outer ceramic element 31b produces low-frequency vibration, wherein the haptic sensation for touches applied can be a tingling.

Figure 6:
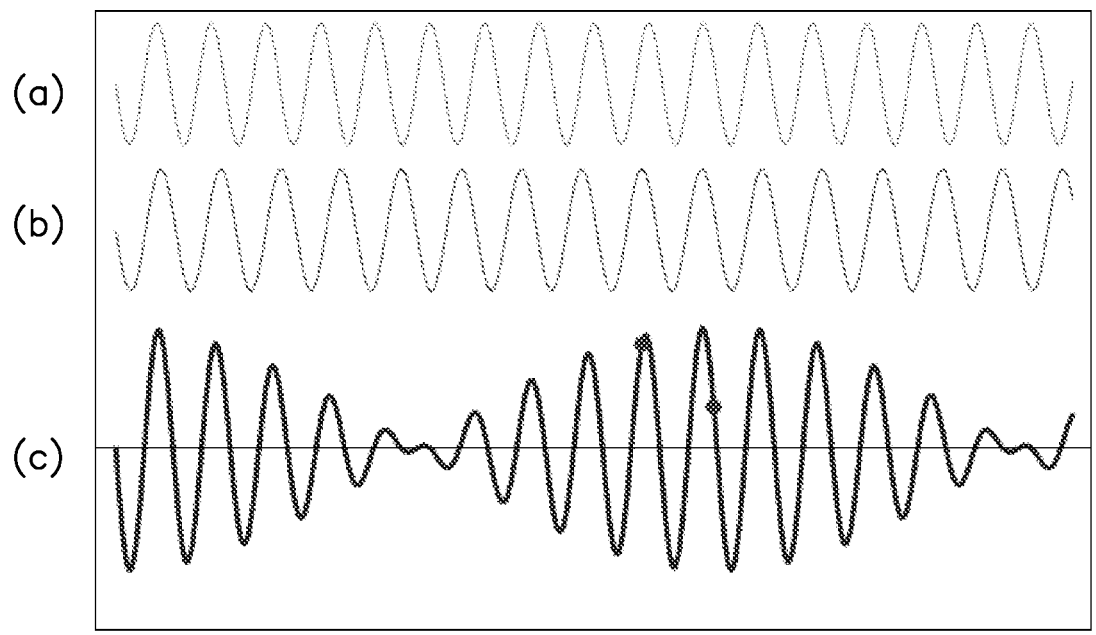
FIG. 6 shows vibration waveforms output by the touch feedback and sensing device in an embodiment of the present disclosure.

Referring to the vibration waveform diagram shown in FIG. 6, the abscissa represents the phase, and the ordinate represents the amplitude. Curve (a) and curve (b) represent the vibration waveforms of the inner ceramic element 31a and the outer ceramic element 31b respectively. Curve (c) represents the a total vibration waveforms of the inner ceramic element 31a and the outer ceramic element 31b.

Each piezoelectric ceramic unit 310 is made of a composite material having a high electromechanical coupling coefficient, such material being mostly used for medical ultrasonic imaging probes.

The touch feedback and sensing device 200 of the present embodiment generates different vibrations by the inner ceramic element 31a and the outer ceramic element 31b, and can impart distinctive tactile sensations.

Third Embodiment

Figure 7:
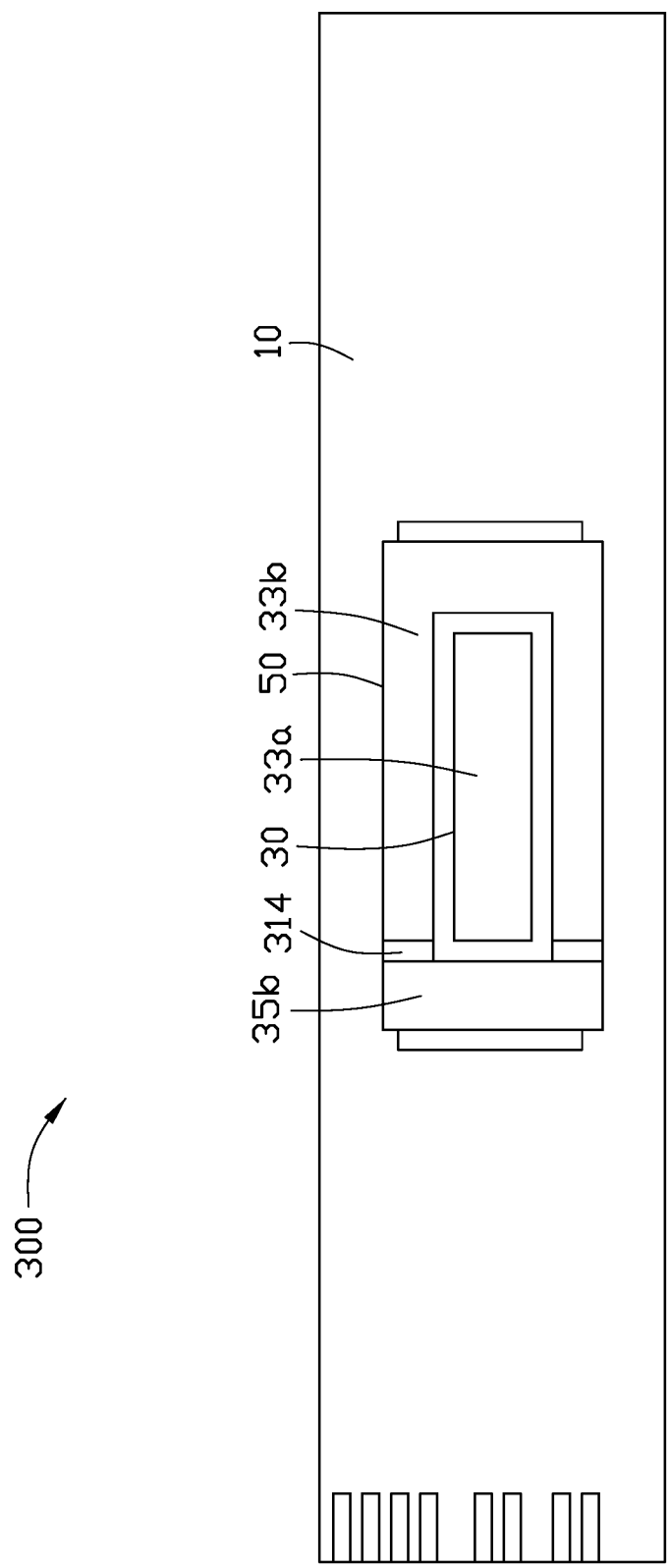
FIG. 7 is a bottom view of a touch feedback and sensing device according to a third embodiment of the present disclosure.
Figure 8:
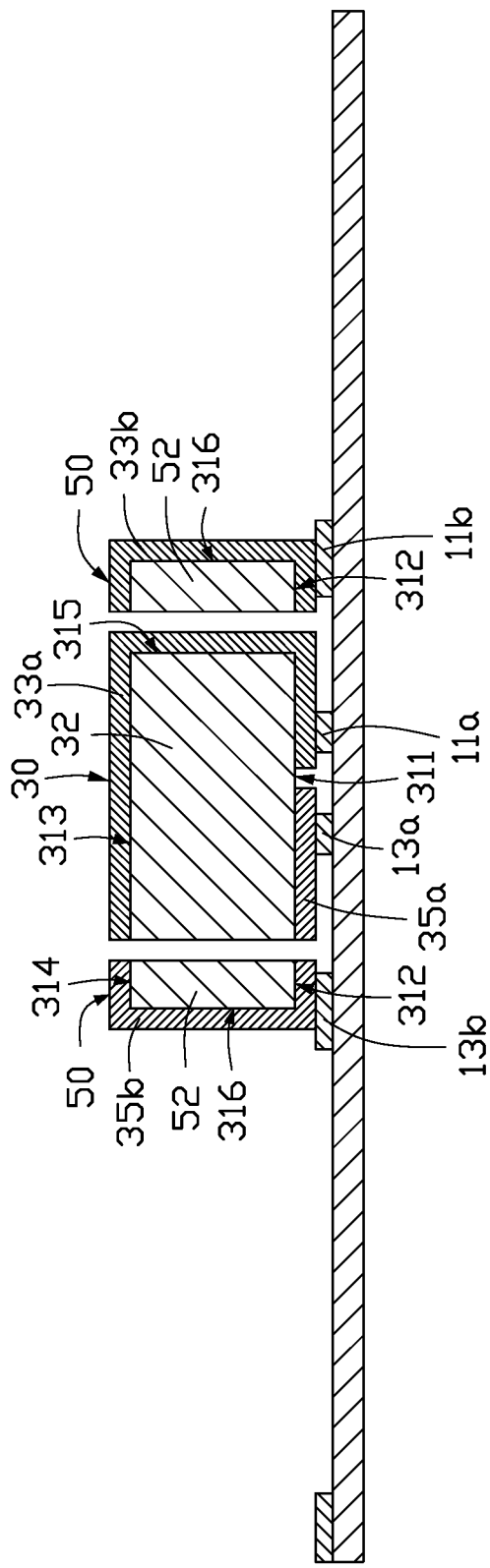
FIG. 8 is a cross-sectional view of the touch feedback and sensing device of FIG. 7.

FIG. 7 and FIG. 8 illustrate a touch feedback and sensing device 300 according to a third embodiment of the present disclosure. The touch feedback and sensing device 300 includes a circuit board 10; a piezoelectric ceramic actuator 30, and a strain sensor 50 located on the circuit board 10.

In the present embodiment, the piezoelectric ceramic actuator 30 includes an inner piezoelectric ceramic 32, and the strain sensor 50 includes an outer piezoelectric ceramic 52. The outer piezoelectric ceramic 52 surrounds the inner piezoelectric ceramic 32 and is spaced apart from the inner piezoelectric ceramic 32. The piezoelectric ceramic actuator 30 further includes a first cathode 33a and a first anode 35a on the inner piezoelectric ceramic 32. The strain sensor 50 further includes a second cathode 33b and a second anode 35b on the outer piezoelectric ceramic 52. The first cathode 33a and the first anode 35a are electrically insulated from each other, and the second cathode 33b and the second anode 35b are electrically insulated from each other. The inner piezoelectric ceramic 32 vibrates to drive the circuit board 10 to vibrate, and the outer piezoelectric ceramic 52 detects the vibration by utilizing the positive piezoelectric characteristic. A voltage value is thereby output by the second cathode 33b and the second anode 35b. When an external force touches the touch feedback and sensing device 300, the vibration waveform and vibration amplitude of the circuit board 10 are changed, and a haptic feedback can be achieved according to voltage changes of the second cathode 33b and the second anode 35b.

In the present embodiment, the inner piezoelectric ceramic 32 has a rectangular block shape. As shown in FIG. 8, the inner piezoelectric ceramic 32 includes a bottom surface 311 adjacent to the circuit board 10, a top surface 313 away from the circuit board 10 and opposite to the bottom surface 311, and several side surfaces 315 between the bottom surface 311 and the top surface 313. The first cathode 33a covers the top surface 313 of the inner piezoelectric ceramic 32 and bends to cover one side surface 315. The first cathode 33a continues to bend to partially cover the bottom surface 311. The first anode 35a partially covers the bottom surface 311 of the inner piezoelectric ceramic 32. An area of the first cathode 33a covering the bottom surface 311 is less than an area of the first anode 35a covering the bottom surface 311. The first cathode 33a and the first anode 35a are spaced apart from each other such that they are electrically insulated from each other.

In the present embodiment, a bottom view of the outer piezoelectric ceramic 52 shows a ring shape which is rectangular, as shown in FIG. 8. The outer piezoelectric ceramic 52 includes a lower surface 312 adjacent to the circuit board 10, an upper surface 314 away from the circuit board 10 and opposite to the lower surface 312, and several lateral surfaces 316 between the lower surface 312 and the upper surface 314. The second cathode 33b partially covers the upper surface 314 of the outer piezoelectric ceramic 52 and bends to cover one lateral surface 316 of the outer ceramic element 31b. The second cathode 33b continues to bend to partially cover the lower surface 312 of the outer piezoelectric ceramic 52. The second anode 35b partially covers the lower surface 312 of the outer piezoelectric ceramic 52 and bends to cover one lateral surface 316 of the outer piezoelectric ceramic 52 The second anode 35b continues to bend to cover the upper surface 314 of the outer piezoelectric ceramic 52. As shown in FIG. 7, an area of the second cathode 33b covering the upper surface 314 is greater than an area of the second anode 35b covering the upper surface 314.

FIG. 8 shows a first cathode electrode 11a, a first anode electrode 13a, a second cathode electrode 11b, and a second anode electrode 13b on the circuit board 10. The first cathode electrode 11a is electrically connected to the first cathode 33a and the first anode electrode 13a is electrically connected to the first anode 35a. The second cathode electrode 11b is electrically connected to the second cathode 33b and the second anode electrode 13b is electrically connected to the second anode 35b.

The circuit board 10 applies different voltages to the first cathode electrode 11a and the first anode electrode 13a, so that the first cathode 33a and the first anode 35a on the inner piezoelectric ceramic 32 have different voltages, the inner piezoelectric ceramic 32 vibrates under the voltage difference. The inner piezoelectric ceramic 32 vibrates by receiving voltage signals by the first cathode electrode 11a and the first anode electrode 13a, and the outer piezoelectric ceramic 52 receives vibration signals to induce charges on the second cathode 33b and the second anode 35b. The charges induced are input by the second cathode electrode 11b and the second anode electrode 13b.

The touch feedback and sensing device 300 of the present embodiment generates vibration when the ring piezoelectric ceramic 32, and the outer piezoelectric ceramic 52 receive the vibration signals. Additional strain sensors are not required, and the device 300 is thus smaller in size.

It is to be understood, even though information and advantages of the present embodiments have been set forth in the foregoing description, together with details of the structures and functions of the present embodiments, the disclosure is illustrative only; changes may be made in detail, especially in matters of shape, size, and arrangement of parts within the principles of the present embodiments to the full extent indicated by the plain meaning of the terms in which the appended claims are expressed.

What is claimed is:

1. A touch feedback and sensing device comprising:
a circuit board;
a piezoelectric ceramic actuator on the circuit board, the piezoelectric ceramic actuator comprising a piezoelectric ceramic block, a cathode and an anode on the piezoelectric ceramic block, two different voltages being applied to the cathode and the anode to vibrate the piezoelectric ceramic block, the circuit board being configured to vibrate with vibrations of the piezoelectric ceramic block; and at least one strain sensor on the circuit board, the at least one strain sensor being configured to detect and monitor vibrations of the circuit board;
wherein the piezoelectric ceramic actuator comprises an inner ceramic element and an outer ceramic element; the outer ceramic element surrounds and is spaced apart from the inner ceramic element; the piezoelectric ceramic actuator further comprises a first cathode and a first anode on the inner ceramic element, a second cathode and a second anode on the outer ceramic element the first cathode and the first anode are applied with different voltages to vibrate the inner ceramic element; the second cathode and the second anode are applied with different voltages to vibrate the outer ceramic element.

2. The touch feedback and sensing device of claim 1, wherein the piezoelectric ceramic block comprises a bottom surface adjacent to the circuit board, a top surface opposite to the bottom surface and away from the circuit board, and multiple side surfaces coupling between the bottom surface and the top surface; the cathode partially covers the bottom surface and bends to cover one side surface, and continues to bend to partially cover the top surface; the anode partially covers the top surface and bends to cover one side surface and partially cover the bottom surface.

3. The touch feedback and sensing device of claim 1, wherein the at least one strain sensor comprises two strain sensors, the two strain sensors are located on opposite sides of the piezoelectric ceramic actuator, and each of the two strain sensors is spaced apart from the piezoelectric ceramic actuator.

4. The touch feedback and sensing device of claim 1, wherein the inner ceramic element comprises a bottom surface adjacent to the circuit board, a top surface away from the circuit board and opposite to the bottom surface, and multiple side surfaces coupling between the bottom surface and the top surface; the first cathode covers the top surface and bends to cover one side surface and partially cover the bottom surface; the first anode partially covers the bottom surface.

5. The touch feedback and sensing device of claim 1, wherein the inner ceramic element comprises a plurality of piezoelectric ceramic units having a columnar structure and spaced apart from each other.

6. The touch feedback and sensing device of claim 1, wherein the outer ceramic element comprises a lower surface adjacent to the circuit board, an upper surface away from the circuit board and opposite to the lower surface, and multiple lateral surfaces coupling between the lower surface and the upper surface; the second cathode partially covers the upper surface and bends to cover one lateral surface and partially cover the lower surface; the second anode partially covers the lower surface and bends to cover one lateral surface and partially cover the upper surface.

7. A touch feedback and sensing device comprising:
a circuit board;
a piezoelectric ceramic actuator on the circuit board, the piezoelectric ceramic actuator comprising a piezoelectric ceramic block, a cathode and an anode on the piezoelectric ceramic block, two different voltages being applied to the cathode and the anode to vibrate the piezoelectric ceramic block, the circuit board being configured to vibrate with vibrations of the piezoelectric ceramic block; and at least one strain sensor on the circuit board, the at least one strain sensor being configured to detect and monitor vibrations of the circuit board; wherein the piezoelectric ceramic actuator comprises an inner piezoelectric ceramic, a first cathode on the inner piezoelectric ceramic, and a first anode on the inner piezoelectric ceramic; the strain sensor comprises an outer piezoelectric ceramic, a second cathode on the outer piezoelectric ceramic, and a second anode on the outer piezoelectric ceramic; the outer piezoelectric ceramic surrounds the inner piezoelectric ceramic and is spaced apart from the inner piezoelectric ceramic.

8. The touch feedback and sensing device of claim 7, wherein the inner piezoelectric ceramic comprises a bottom surface adjacent to the circuit board, a top surface away from the circuit board and opposite to the bottom surface, and multiple side surfaces coupling between the bottom surface and the top surface; the first cathode covers the top surface and bends to cover one side surface and partially cover the bottom surface; the first anode partially covers the bottom surface.

9. The touch feedback and sensing device of claim 7, wherein the outer piezoelectric ceramic comprises a lower surface adjacent to the circuit board, an upper surface away from the circuit board and opposite to the lower surface, and multiple lateral surfaces connecting between the lower surface and the upper surface; the second cathode partially covers the upper surface of the outer piezoelectric ceramic and bends to cover one lateral surface and partially cover the lower surface; the second anode partially covers the lower surface and bends to cover one lateral surface and partially cover the upper surface.

* * * * *